United States Patent
Mizusawa et al.

(10) Patent No.: US 11,491,772 B2
(45) Date of Patent: Nov. 8, 2022

(54) SUBSTRATE BONDING METHOD AND LAMINATED BODY PRODUCTION METHOD

(71) Applicant: TOKYO OHKA KOGYO CO., LTD., Kawasaki (JP)

(72) Inventors: Ryuma Mizusawa, Kawasaki (JP); Tomoyuki Ando, Kawasaki (JP)

(73) Assignee: TOKYO OHKA KOGYO CO., LTD., Kawasaki (JP)

(*) Notice: Subject to any disclaimer, the term of this patent is extended or adjusted under 35 U.S.C. 154(b) by 793 days.

(21) Appl. No.: 16/328,603

(22) PCT Filed: Sep. 13, 2017

(86) PCT No.: PCT/JP2017/033138
§ 371 (c)(1),
(2) Date: Feb. 26, 2019

(87) PCT Pub. No.: WO2018/052045
PCT Pub. Date: Mar. 22, 2018

(65) Prior Publication Data
US 2021/0283893 A1    Sep. 16, 2021

(30) Foreign Application Priority Data
Sep. 16, 2016  (JP) .............................. JP2016-182152

(51) Int. Cl.
*B32B 37/10*    (2006.01)
*B32B 37/00*    (2006.01)
(Continued)

(52) U.S. Cl.
CPC ............ *B32B 37/10* (2013.01); *B32B 37/025* (2013.01); *B32B 37/26* (2013.01); *G03F 7/38* (2013.01); *G03F 7/40* (2013.01); *B32B 2037/268* (2013.01)

(58) Field of Classification Search
CPC ....................................................... B32B 37/10
See application file for complete search history.

(56) References Cited

U.S. PATENT DOCUMENTS 4,159,222 A * 6/1979 Lebow .................. H05K 3/205
                                                       156/153
5,582,678 A * 12/1996 Komuro ................. B41J 2/1604
                                                       216/27
(Continued)

FOREIGN PATENT DOCUMENTS

JP         10036143 A  *  2/1998
JP       H10-335779 A     12/1998
(Continued)

OTHER PUBLICATIONS

Extended European Search Report issued in European Patent Application No. 17850946.9, dated Apr. 22, 2020.

*Primary Examiner* — Francisco W Tschen
*Assistant Examiner* — Abhishek A Patwardhan
(74) *Attorney, Agent, or Firm* — Knobbe, Martens, Olson & Bear LLP

(57) ABSTRACT

A substrate bonding method which enables forming a precision fine space using a method that is simpler and easier than conventional methods; and a laminated body production method that uses the substrate bonding method. This substrate bonding method includes disposing a first substrate on a photoresist pattern formed on a support film so as to bring the first substrate into contact with a surface of the photoresist pattern located on the side opposite to the support film, and pressure-bonding the support film, the photoresist pattern, and the first substrate; releasing the bonded support film after the pressure-bonding; and disposing a second substrate on the photoresist pattern so as to bring the second substrate into contact with the surface of the photoresist pattern located on the side opposite to the (Continued)

first substrate, and pressure-bonding the first substrate, the photoresist pattern, and the second substrate.

9 Claims, 2 Drawing Sheets

(51) Int. Cl.
*B32B 37/26* (2006.01)
*G03F 7/38* (2006.01)
*G03F 7/40* (2006.01)

(56) References Cited

U.S. PATENT DOCUMENTS

| | | | |
|---|---|---|---|
| 8,187,408 B2* | 5/2012 | Yamanouchi | B32B 3/30 |
| | | | 156/292 |
| 2006/0188697 A1 | 8/2006 | Lee | |
| 2009/0173433 A1 | 7/2009 | Yamanouchi et al. | |
| 2010/0159405 A1* | 6/2010 | Ishikura | G03F 7/0002 |
| | | | 430/326 |
| 2011/0042124 A1* | 2/2011 | Matsui | H05K 3/4632 |
| | | | 174/157 |
| 2014/0178646 A1 | 6/2014 | Wolk et al. | |

FOREIGN PATENT DOCUMENTS

| | | |
|---|---|---|
| JP | 2004-063694 A | 2/2004 |
| JP | 2006-216563 A | 8/2006 |
| JP | 2008-000964 A | 1/2008 |
| JP | 2010-166029 A | 7/2010 |

* cited by examiner

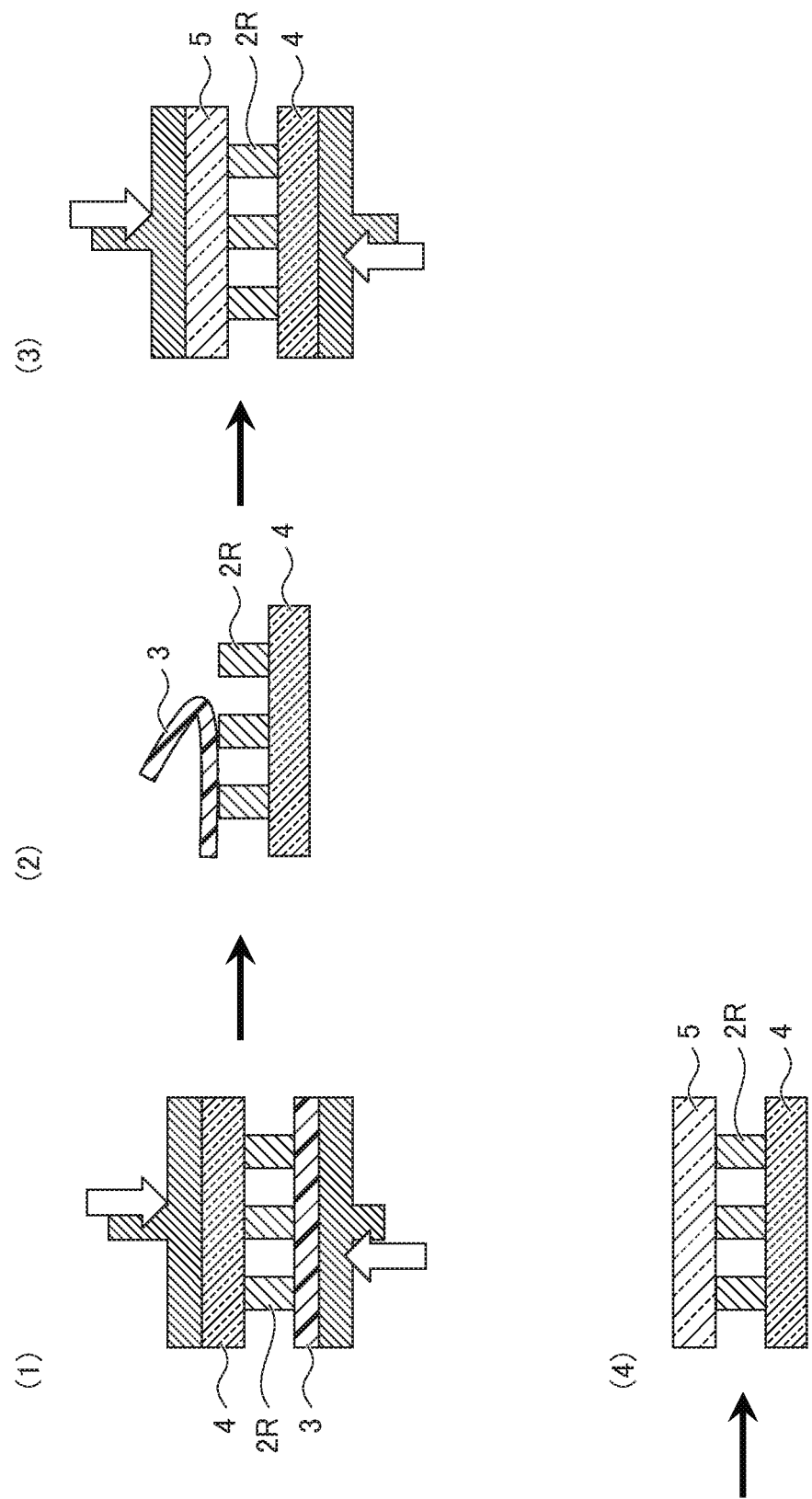

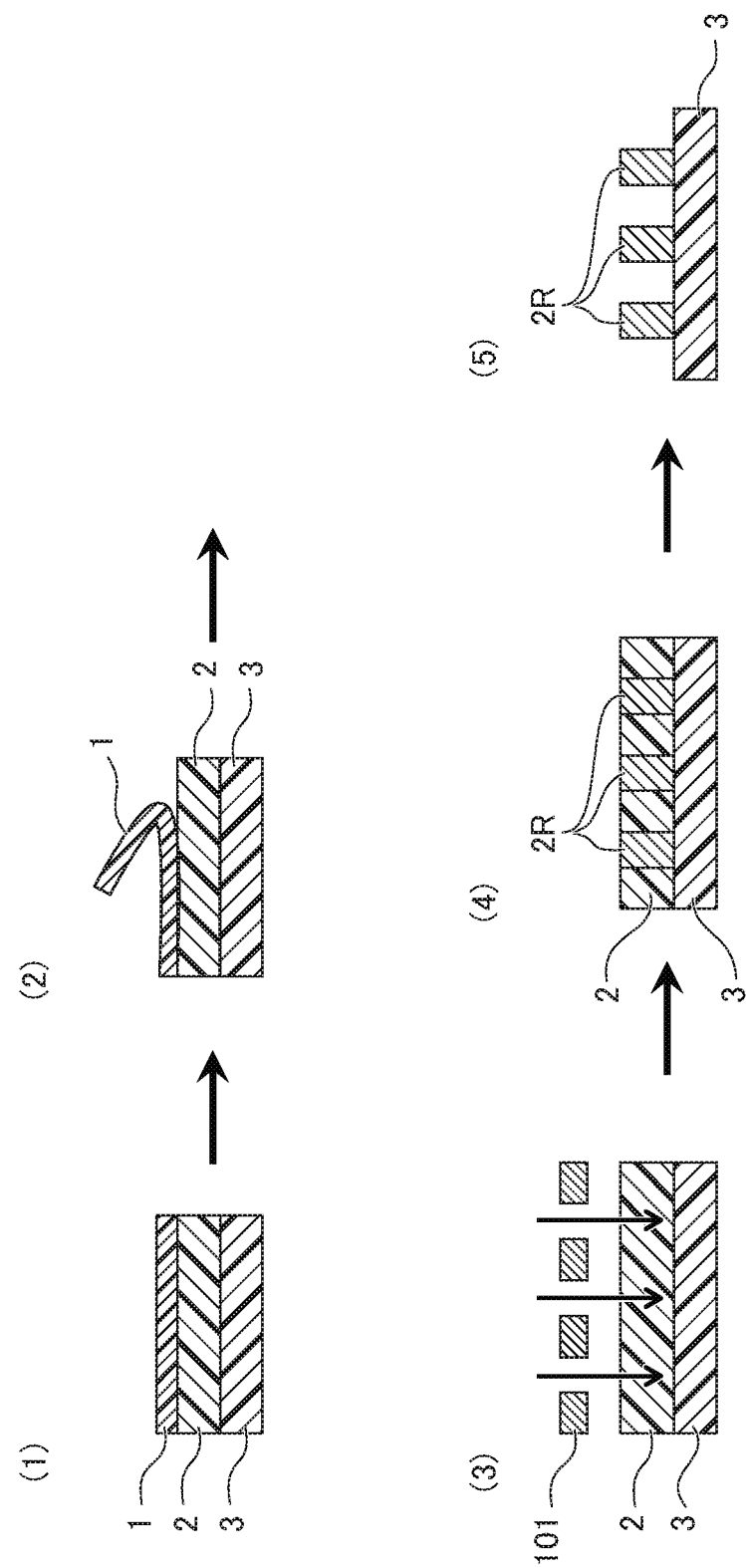

SUBSTRATE BONDING METHOD AND LAMINATED BODY PRODUCTION METHOD

This application is the U.S. National Phase under 35 U.S.C. § 371 of International Application PCT/JP2017/033138, filed Sep. 13, 2017, designating the U.S., and published in Japanese as WO 2018/052045 on Mar. 22, 2018 which claims priority to Japanese Patent Application No. 2016-182152, filed Sep. 16, 2016, the entire content of which is incorporated herein by reference.

TECHNICAL FIELD

The present invention relates to a substrate bonding method and a laminated body production method.

BACKGROUND ART

A technique for obtaining various effects by forming a precision fine space in a variety of products and further forming a member having this fine space has drawn attention in the industrial field in recent years.
A technique in which a precision fine space is formed in a semiconductor device and an air layer existing in this space is used as a dielectric layer, and a technique of e.g. a liquid discharging device in which many precision fine spaces are formed and an element to electrically or thermally generate pressure is built therein to quantitatively and continuously discharge liquid such as ink filled in the precision fine spaces for example have been developed.

As a method for forming such precision fine space, for example in a method for forming a precision fine space, having a step for laying a film on a substrate having a precise fine concave portion, a method has been proposed, in which a substrate is placed on a first stage, the uppermost surface of a second stage covering the outer periphery of the first stage is set to be higher than the uppermost surface of the first stage, and a film is laid on the above substrate (for example Patent Document 1).

Patent Document 1: Japanese Unexamined Patent Application, Publication No. 2008-964

DISCLOSURE OF THE INVENTION

Problems to be Solved by the Invention

In addition, in order to form a precision fine space, a method has been conventionally used, in which a dry film formed by laminating a photosensitive resin composition layer, a support film and a release film so as to put the photosensitive resin composition layer between the support film and the release film is used, the release film is released, the surface of the photosensitive resin composition layer is pressure-bonded to a substrate, the support film is then released, a photolithography technique is applied to the exposed photosensitive resin composition layer to form a photoresist pattern, another substrate is then laminated so as to put the photoresist pattern between the above substrate and another substrate and pressure-bonded, and the photoresist pattern is put between these two substrates to form a precision fine space.

The structure of precision fine spaces has got complicated in recent years, and for example a method which enables forming even a structure in which structures forming separate precision fine spaces by a plurality of layers are laminated is desired.

However, it has been difficult to laminate a plurality of structures forming precision fine spaces by the conventional method for laying films described above.
In addition, in order to deal with complication of the structure of precision fine spaces, it is desired that the structure of a precision fine space be formed more freely than before.
Furthermore, it is required that even that complicated structure be efficiently produced by as few steps as possible.
However, a method which enables producing such precision fine space has not existed until now.

The present invention was made in view of the above problems, and an object thereof is to provide a substrate bonding method, which enables forming a precision fine space using a method simpler and easier than conventional methods, and a laminated body production method using the substrate bonding method.

Means for Solving the Problems

The present inventors found a method for bonding two substrates through a photoresist pattern by pressure-bonding a first substrate to a surface of the photoresist pattern formed on a support film such as a dry film, which surface is located on the side opposite to the support film, then substituting the support film with a second substrate and pressure-bonding the second substrate to the photoresist pattern, thereby completing the present invention.
By the method, a photoresist pattern is put between two substrates to form a precision fine space.

The first aspect of the present invention is a substrate bonding method, including:
a first pressure-bonding step for disposing a first substrate on a photoresist pattern formed on a support film so as to bring the first substrate into contact with a surface of the photoresist pattern located on the side opposite to the support film, and pressure-bonding the above support film, the above photoresist pattern and the above first substrate; a support film release step for releasing the above support film after the above pressure-bonding; and
a second pressure-bonding step for disposing a second substrate on the above photoresist pattern so as to bring the second substrate into contact with a surface of the photoresist pattern located on the side opposite to the above first substrate, and pressure-bonding the above first substrate, the above photoresist pattern and the above second substrate.

The second aspect of the present invention is a method for producing a laminated body by laminating a first substrate, a photoresist pattern and a second substrate in this order using the substrate bonding method of the first aspect of the present invention.

Effects of the Invention

According to the present invention, it is possible to provide a substrate bonding method which enables forming a precision fine space by a method simpler and easier than conventional methods, and a laminated body production method using the substrate bonding method.

BRIEF DESCRIPTION OF THE DRAWINGS

FIG. 1 is a schematic cross-sectional view which shows steps in the substrate bonding method of the present invention.

FIG. 2 is a schematic cross-sectional view which shows an example of steps for producing a support film on which a photoresist pattern is formed, used in the present invention.

PREFERRED MODE FOR CARRYING OUT THE INVENTION

<<Substrate Bonding Method>>

The substrate bonding method of the first aspect of the present invention includes a first pressure-bonding step, a support film release step and a second pressure-bonding step as described above.

The method will now be described in detail properly referring to FIG. 1 and FIG. 2.

It should be noted that the embodiment of the present invention shown in each figure is just one embodiment, and the present invention is not limited thereto.

<First Pressure-Bonding Step>

The first pressure-bonding step in the substrate bonding method of the embodiment includes disposing a first substrate on a photoresist pattern formed on a support film so as to bring the first substrate into contact with a surface of the photoresist pattern located on the side opposite to the above support film, and pressure-bonding the above support film, the above photoresist pattern and the above first substrate.

In the embodiment, the photoresist pattern is not particularly limited, and for example one formed from a conventionally known photosensitive resin composition which can be used for a photolithography technique by a conventionally known method can be used.

The photoresist pattern is not particularly limited as long as it is formed on a support film; however, a photoresist pattern can be suitably formed commonly using a dry film formed by laminating the support film, a photosensitive resin composition layer and a release film in this order.

The dry film will be described below.

As shown in the schematic cross-sectional view in (1) of FIG. 1, in the first pressure-bonding step in the embodiment, a first substrate 4 is disposed on a photoresist pattern 2R on a support film 3 so as to bring the first substrate 4 into contact with a surface of the photoresist pattern located on the side opposite to the support film 3.

As described above, the first substrate 4 brought into contact with the photoresist pattern 2R is located on a site in which a release film had existed in the above-described dry film as a site in the photoresist pattern.

The first substrate will be described below.

In the first pressure-bonding step, a laminated body formed by laminating the support film 3, photoresist pattern 2R and first substrate 4 in this order is then pressure-bonded. The pressure-bonding can be carried out by a known method. The pressure-bonding in the first pressure-bonding step only needs to be carried out on conditions that the photoresist pattern 2R and the first substrate 4 be at least bonded, and is carried out under conditions of preferably 0.001 to 1000 MPa, more preferably 0.01 to 500 MPa and further preferably 0.05 to 200 MPa, and also preferably 100° C. or higher, more preferably 100 to 300° C., further preferably 100 to 250° C. and further more preferably 100 to 200° C.

The conditions vary depending on e.g. the materials and thicknesses of the support film 3, photoresist pattern 2R and first substrate 4, and such pressure-bonding is carried out for preferably 1 second to 30 minutes, more preferably 5 seconds to 15 minutes, and further preferably 10 seconds to 10 minutes.

The pressure-bonding in the first pressure-bonding step can be carried out on the same conditions as pressure-bonding in the second pressure-bonding step; however, the pressure-bonding in the second pressure-bonding step, a post-process, is also carried out, and thus the pressure-bonding in the first pressure-bonding step can be carried out on conditions easier than those of the pressure-bonding in the second pressure-bonding step. In particular, temperature can be lower than that of the pressure-bonding in the second pressure-bonding step.

As pressure-bonding, so-called thermal pressure-bonding method can be used, in which a first substrate is heated in advance (preheated), and a laminated body formed by laminating a photoresist pattern and support film is put and pressed on the first substrate. When the first substrate is made of metal, the thermal pressure-bonding method can be preferably used. In addition to the first substrate or instead of the first substrate, for example, a surface of a member brought into contact with an object to be pressure-bonded in a pressure-bonding device is preheated and thermal pressure-bonding can be carried out.

When the first substrate is made of metal, for example, the preheating temperature is for example 100 to 300° C., and preferably 100 to 200° C. as surface temperature of the first substrate on the side brought into contact with a photoresist pattern.

The photoresist pattern 2R is not particularly limited, and one which has bonding properties to an extent that the photoresist pattern is bonded to a substrate by pressure-bonding is preferred.

Such bonding properties are properties commonly possessed by a photoresist pattern which is formed from a photosensitive resin composition generally used, described below.

<Support Film Release Step>

The support film release step in the substrate bonding method of the embodiment includes releasing the support film after the above pressure-bonding.

As shown in the schematic cross-sectional view in (2) of FIG. 1, in the support film release step in the embodiment, the support film 3 is released from a laminated body formed by laminating the support film 3, photoresist pattern 2R and first base material 4 in this order, which has been pressure-bonded in the first pressure-bonding step, the pre-process. The method for releasing the support film 3 is not particularly limited.

<Second Pressure-Bonding Step>

The second pressure-bonding step in the substrate bonding method of the embodiment includes disposing a second substrate on the photoresist pattern so as to bring the second substrate into contact with a surface of the photoresist pattern located on the side opposite to the first substrate, and pressure-bonding the above first substrate, the above photoresist pattern and the above second substrate.

As shown in the schematic cross-sectional view in (3) of FIG. 1, a second substrate 5 is brought into contact with a surface of the photoresist pattern 2R exposed by releasing the support film in the support film release step, the pre-process, i.e. a surface on the side opposite to the first substrate 4, that is, a surface to which the support film released in the pre-process had been bonded.

In the second pressure-bonding step, a laminated body formed by laminating the first substrate 4, photoresist pattern 2R and second substrate 5 in this order as described above is then pressure-bonded.

The pressure-bonding can be carried out in the same manner as in the pressure-bonding in the first pressure-bonding step, and is preferably carried out by gang bonding.

The pressure-bonding in the second pressure-bonding step can be carried out on conditions that the photoresist pattern 2R and the second substrate 5 be at least bonded, and is carried out under conditions of preferably 0.001 to 1000 MPa, more preferably 0.01 to 500 MPa, and further preferably 0.05 to 200 MPa, and also preferably 100 to 300° C., more preferably 100 to 250° C., and further preferably 100 to 200° C.

The conditions vary depending on e.g. the materials and thicknesses of the photoresist pattern 2R and second substrate 5, and such pressure-bonding is carried out for preferably 5 seconds to 30 minutes, more preferably 10 seconds to 15 minutes, and further preferably 15 seconds to 10 minutes. The pressure-bonding is preferably thermal pressure-bonding, and the thermal pressure-bonding can be carried out on the same conditions as the thermal pressure-bonding in the first pressure-bonding step described above.

The first substrate and the second substrate may be of the same or different type.

The first substrate and the second substrate are not particularly limited, and conventionally known ones can be used. Examples thereof can include substrates for electronic parts, and these substrates on which a predetermined wiring pattern is formed, and the like.

Examples of the substrates include substrates made of metal such as silicon, silicon nitride, titanium, tantalum, palladium, titanium-tungsten, copper, chromium, iron and aluminum, resin substrates such as engineering plastics and polyethylene terephthalate, glass substrates and the like.

In the embodiment, as the first substrate and/or second substrate, even those which have a structure on at least part of their surfaces brought into contact with the above-described photoresist pattern can be preferably used. The structure can be for example a structure which forms a concave-convex structure, in particular a convex structure on at least part of the surfaces of the first substrate and/or second substrate brought into contact with the photoresist pattern.

In addition, the structure can be a structure which is often provided to e.g. a substrate for electronic parts, and can be for example at least one selected from the group consisting of wiring, a circuit and an electrode.

As materials for e.g. wiring, circuits and electrodes, for example copper, solder, chromium, aluminum, nickel, gold and the like are used.

As shown in the schematic cross-sectional view in (4) of FIG. 1, a laminated body formed by laminating the first substrate 4, photoresist pattern 2R and second substrate 5 in this order can be obtained by the steps described above. A precision fine space based on the shape and structure of the photoresist pattern will be formed by putting the photoresist pattern 2R between two substrates consisting of the first substrate 4 and second substrate 5.

In the embodiment, the photoresist pattern formed on the support film used in the above-described first pressure-bonding step can be formed using a dry film formed by laminating a support film 3, photosensitive resin composition layer 2 and release film 1 in this order as shown in the schematic cross-sectional view in (1) of FIG. 2 as a typical example.

In the embodiment, the support film is not particularly limited as long as it is a film which can be used for the pressure-bonding in the first pressure-bonding step, and examples thereof include a polyethylene terephthalate (PET) film, a polypropylene (PP) film, a polyethylene (PE) film and the like. The polyethylene terephthalate (PET) film is preferred in respect of strength to pressure-bonding and versatility in dry films.

The thickness of the support film is preferably 6 to 350 µm, and more preferably 10 to 100 µm.

The support film can be one having light permeability, and also can be one which is subjected to release treatment in order that the support film can be easily released from a photoresist pattern.

The photosensitive resin composition forming a photosensitive resin composition layer is not particularly limited, and for example a photosensitive resin composition which is commonly used to form a photosensitive resin composition layer in a dry film can be used. The photosensitive resin composition can be a positive type photosensitive resin composition or a negative type photosensitive resin composition.

Here, the positive type photosensitive resin composition can be non-chemically amplified type or chemically amplified type. Examples of the non-chemically amplified positive type photosensitive resin composition include one including at least a quinone diazide group-containing compound and an alkali soluble resin.

On the other hand, examples of the chemically amplified positive type photosensitive resin composition include a resin having an acid dissociable leaving group, which is eliminated due to an action of an acid generated from a photoacid generator by exposure to increase alkali solubility, and one including at least a photoacid generator.

In addition, examples of the negative type photosensitive resin composition include a polymerizable negative type photosensitive resin composition including at least an alkali soluble resin, a photopolymerizable monomer and a photopolymerization initiator; a chemically amplified negative type photosensitive resin composition including at least an alkali soluble resin, a cross-linking agent and an acid generator; a resin having an acid dissociable leaving group, which is eliminated due to an action of an acid generated from a photoacid generator by exposure to increase polarity, and a chemically amplified negative type photosensitive resin composition for a solvent development process including at least a photoacid generator.

The method for laminating a photosensitive resin composition layer on a support film is not particularly limited, and for example a method can be used, in which using e.g. an applicator, a bar coater, a wire bar coater, a roll coater, or a curtain flow coater, a photosensitive resin composition is applied on a support film so that the film thickness after drying is preferably 5 to 300 µm, more preferably 15 to 150 µm, and particularly preferably 20 to 130 µm and dried.

The dry film may further have a release film 1 on the photosensitive resin composition layer.

The release film 1 can be generally referred to as a protection film, and various known films such as a polyethylene terephthalate (PET) film, a polypropylene (PP) film, and a polyethylene (PE) film can be used. These can be used individually or a plurality of the films can be used in combination.

It should be noted that the release film 1 is not particularly required because it is released in the embodiment, and thus a dry film without a release film can be also used in the embodiment.

As the photoresist pattern used for the base material bonding method of the embodiment, one formed by a step including site-selectively exposing a photosensitive resin composition layer laminated on a support film and then developing the layer can be used.

When the photoresist pattern is used from a dry film, as shown in the schematic cross-sectional view in (2) of FIG. 2, the release film 1 of the dry film is released to expose the photosensitive resin composition layer 2, and the photoresist pattern is formed from the photosensitive resin composition layer 2.

The patterning of the photoresist pattern can be also carried out by, in addition to the above exposure method, for example etching such as dry etching or wet etching, and moreover an imprint technology (imprint lithography), an inkjet printing method and the like.

The method for site-selectively exposing the photosensitive resin composition layer 2 laminated on the support film 3 is not particularly limited, and the exposure is carried out depending on the pattern shape of a photoresist pattern.

As shown in the schematic cross-sectional view in (3) of FIG. 2, selectively exposing the photosensitive resin composition layer 2 is commonly carried out through mask 101 with a shape depending on the pattern shape of the photoresist pattern. Examples of radiation used for exposure include ultraviolet rays emitted from e.g. a low pressure mercury lamp, a high pressure mercury lamp, a metal halide lamp, a g-line stepper or an i-line stepper, an electron beam, a laser beam and the like.

The exposure varies depending on e.g. light sources used and the thickness of a coated film, and is commonly 1 to 1000 mJ/cm$^2$, preferably 10 to 500 mJ/cm$^2$.

As shown in the schematic cross-sectional view in (4) of FIG. 2, resist parts 2R with a shape depending on the pattern shape of the photoresist pattern are formed in the photosensitive resin composition layer 2 by exposure and, as needed, heating (PEB).

The conditions of heating (PEB) after exposure vary depending on e.g. the types and proportions combined of components in a composition and the thickness of a coated film, and are a temperature of for example 60 to 150° C., commonly 70 to 140° C., preferably 80 to 130° C., and for example 30 to 600 seconds, commonly 45 to 300 seconds, preferably 60 to 180 seconds. It should be noted that a case where the photosensitive resin composition layer is formed from a negative type photosensitive resin composition is shown in the schematic cross-sectional views in (3) and (4) of FIG. 2; however, the embodiment is not limited thereto, and a positive type photosensitive resin composition can be also used.

The method for developing the site-selectively exposed photosensitive resin composition layer is not particularly limited, and development is generally carried out by dissolving and removing non-resist parts such as uncured parts using a developing solution as shown in the schematic cross-sectional view in (5) of FIG. 2.

The resist parts remaining on the support film 3 after such removal form a photoresist pattern 2R.

As the developing solution, known developing solutions can be used, and for example, general-purpose alkali developing solutions such as alkali developing solutions, i.e. hydroxides of alkali metal such as lithium, sodium and potassium; ammonium hydroxides such as tetraethylammonium hydroxide; and aqueous solutions including sulfonium hydroxides such as trimethylsulfonium hydroxide; organic solvents, i.e. ketones such as acetone, methylethylketone, cyclohexane, methyl isoamyl ketone and 2-heptanone; polyalcohols ((poly)alkylene glycol, etc.) such as ethylene glycol, propylene glycol, diethylene glycol, ethylene glycol monoacetate, propylene glycol monoacetate or diethylene glycol monoacetate, or monomethyl ether, monoethyl ether, monopropyl ether, monobutyl ether or monophenyl ether thereof, and derivatives thereof ((poly)alkylene glycol monoalkyl ether, (poly)alkylene glycol dialkyl ether, (poly)alkylene glycol monoalkyl ether acetate, etc.); and esters such as ethyl lactate, methyl acetate, ethyl acetate, butyl acetate, methyl pyruvate, ethyl pyruvate, methyl methoxypropionate, and ethyl ethoxypropionate can be used.

As treatment after development, the photoresist pattern can be further cured, as needed, by heating at about 60 to 250° C. or exposure at about 100 to 2000 mJ/cm$^2$ depending on the types of resin used for a photosensitive resin composition after washing with e.g. running water.

In the substrate bonding method of the embodiment, commercially available dry films can be widely and suitably used without limiting to the above-described dry film. When a commercially available dry film is used, a dry film having a photoresist pattern formed by a step including site-selectively exposing, for example as described above, a photosensitive resin composition layer exposed by releasing a release film or a protection film depending on purposes and then developing the layer, can be used in the above-described first pressure-bonding step in the substrate bonding method of the embodiment.

As described above, even a commercially available dry film can be suitably applied to the substrate bonding method of the embodiment, and the method is a method which is used for various purposes and useful.

<<Laminated Body Production Method>>

The method for producing a laminated body by laminating a first substrate, photoresist pattern and second substrate in this order using the substrate bonding method, the first aspect of the present invention, is also one of the present invention.

Also, in the laminated body production method, the second aspect of the present invention, the first substrate, photoresist pattern and second substrate are as described above in the substrate bonding method, the first aspect of the present invention.

In the embodiment, a photoresist pattern is not formed directly on a substrate as before, but formed on a support film as described above.

In the embodiment, the photoresist pattern thus formed on a support film in advance is, so to speak, transferred to the first substrate, the support film is released, and the second substrate is pressure-bonded instead.

Therefore, according to the embodiment, it is not required to directly form a photoresist pattern on a first substrate and second substrate.

Because of this, in the embodiment, the first substrate and the second substrate are not particularly limited, as long as they have strength capable of being used for pressure-bonding in the above-described first pressure-bonding step and second pressure-bonding step, and, when thermal pressure-bonding is carried out as the pressure-bonding, also have strength and heat resistance capable of being used for the thermal pressure-bonding. Various substrates can be used.

In the embodiment, even a substrate having a site causing a change on a surface brought into contact with a photoresist pattern by at least one step selected from the group consisting of pressure-bonding, exposure and development and/or a photosensitive resin composition can be used as a second substrate, and moreover particularly can be used as a first substrate, and also can be used as a first substrate and a second substrate.

In conventional methods, because a photoresist pattern is directly formed on a substrate, burdens such as heat, radiation and pressure are applied to the substrate, like for example pressure applied in the pressure-bonding step; pressure and heat when thermal pressure-bonding is carried out as pressure-bonding in the pressure-bonding step; radiation such as a ghi-line irradiated in the exposure step; developing solutions such as an aqueous alkali solution and an organic solvent used for exposure in the development step; contact with an organic solvent and other various chemicals included in a photosensitive resin composition; and irradiation and heating to cure a photosensitive resin composition layer and/or resist parts thereof in a photoresist pattern forming process; etc. In addition, when exposed to a variety of chemicals, there is a risk that any change like chemical and/or physical changes such as changes in quality and damages can be generally caused on the substrate.

In the case of a substrate having the above-described structure on a surface brought into contact with a photoresist pattern, for example, such risk can be strong.

Therefore, conventional methods in which a photoresist pattern is directly formed on a substrate have not been able to use a substrate having such site causing a change on a surface brought into contact with a photoresist pattern.

In the embodiment, contrarily, a photoresist pattern is formed on a support film as described above, and is not directly formed on a substrate. Accordingly, the above risk of changes is eliminated or reduced as much as possible.

The embodiment can use various substrates also in this respect, and is a method which is used for various purposes and useful.

In the embodiment, as described above, a substrate having a structure on at least part of a surface brought into contact with a photoresist pattern can be used as a second substrate, and moreover particularly can be used as a first substrate, and also can be used as a first substrate and a second substrate.

As described above, the embodiment can use various substrates, and moreover can freely use even a substrate having a structure on at least part of a surface brought into contact with a photoresist pattern regardless of a first substrate or a second substrate.

As described above, the embodiment provides a degree of freedom with a method for forming a precision fine space, and thus enables designing a precision fine space depending on various needs.

In conventional methods in which a photoresist pattern is directly formed on a substrate, contrarily, a substrate, which corresponds to a first substrate in the embodiment because the substrate is first brought into contact with a photoresist pattern, has not been able to be used because, if the substrate is a substrate having a structure as described above on at least part of a surface brought into contact with a photoresist pattern, it is required to avoid the above-described change which can be caused when directly forming the photoresist pattern on the surface.

As described above, the method in the embodiment is a method which enables forming a precision fine space by a method having fewer steps and being simpler and easier than conventional methods.

The method of the embodiment can also form a laminated body by putting a photoresist pattern between a first substrate and a second substrate, and such laminated body generally has an external shape formed by two substrates having strength, and thus can produce a member having a precision fine space with excellent dimension accuracy, and it is also easy to pile up a plurality of laminated bodies.

Therefore, by repeatedly using the method of the embodiment, for example, photoresist patterns can be laminated through substrates, and thus even a structure, in which structures forming separate precision fine spaces by a plurality of layers are laminated, can be easily produced.

As described above, the embodiment is a method which can also deal with complication of the structure of a precision fine space.

Furthermore, the embodiment can efficiently produce even a complicated structure by as few steps as possible.

<<Laminated Body>>

The laminated body formed by laminating a first substrate, a photoresist pattern and a second substrate in this order, obtained by the present invention is a structure including a precision fine space formed by putting a photoresist pattern between two substrates.

Such laminated body is not particularly limited, and can be preferably used, for example, as a member to provide a precision fine space for e.g. forming an element formed mainly in an electronic part, for example a spacer between a semiconductor wafer and a transparent substrate, and a precision fine space having a fine structure. For example, the laminated body can be used for e.g. liquid discharge heads such as a SAW filter, an inkjet head, a resist droplet discharge head, and a DNA droplet discharge head, and moreover can be used for example for e.g. a micro optical array, a microswitch, a micro relay, an optical switch, and a pressure sensor.

EXAMPLES

The present invention will now be described in more detail by way of Examples. It should be noted, however, that the present invention is not limited to these Examples.

On a PET film used as a support film, a dry film resist, TMMR 52000 (manufactured by TOKYO OHKA KOGYO CO., LTD.) was applied as a photosensitive resin composition by an applicator. On the dried coated film, a PET film was laminated as a release film. A dry film formed by laminating a support film 3, a photosensitive resin composition layer 2 with a film thickness of 50 μm and a release film 1 in this order was obtained as shown in the schematic cross-sectional view in (1) of FIG. 2.

About the obtained dry film, the release film 1 of the dry film was released as shown in the schematic cross-sectional view in (2) of FIG. 2. As shown in the schematic cross-sectional view in (3) of FIG. 2, the exposed photosensitive resin composition layer 2 was site-selectively exposed to ghi line through mask 101 at a dose of 250 mJ/cm$^2$ using Prisma GHI (manufactured by Ultratech, Inc.), and then put on a hot plate (not shown) so as to bring the support film 3 into contact with the hot plate as shown in the schematic cross-sectional view in (4) of FIG. 2, and heated (PEB) after exposure at 80° C. for 5 minutes to form resist parts 2R. Then, as shown in the schematic cross-sectional view in (5) of FIG. 2, propylene glycol monomethyl ether acetate (PGMEA) was added dropwise to the photosensitive resin composition layer, which was left at 23° C. for 60 seconds. This was repeated 4 times for development, and then nitrogen was blown to obtain a photoresist pattern 2R.

As shown in the schematic cross-sectional view in (1) of FIG. 1, a first pressure-bonding step was carried out, in which a first substrate 4 was disposed on the obtained photoresist pattern 2R formed on the support film 3 so as to bring the first substrate 4 into contact with a surface of the photoresist pattern located on the side opposite to the support film 3, and the support film 3, photoresist pattern 2R and first substrate 4 were pressure-bonded at 150° C. and 100 MPa.

Next, after a support film release step for releasing the support film 3 as shown in the schematic cross-sectional view in (2) of FIG. 1, a second substrate 5 was disposed on the photoresist pattern 2R so as to bring the second substrate 5 into contact with a surface of the photoresist pattern located on the side opposite to the first substrate 4 as shown in the schematic cross-sectional view in (3) of FIG. 1, and a laminated body formed by laminating the first substrate 4, photoresist pattern 2R and second substrate 5 in this order was obtained by a second pressure-bonding step for pressure-bonding the first substrate 4, photoresist pattern 2R and second substrate 5 at 200° C. and 100 MPa as shown in the schematic cross-sectional view in (4) of FIG. 1.

EXPLANATION OF REFERENCE NUMERALS

1 Release film
2 Photosensitive resin composition layer
2R Resist part or photoresist pattern in photosensitive resin composition layer
3 Support film
4 First substrate
5 Second substrate
101 Mask

The invention claimed is:

1. A substrate bonding method, comprising:
   disposing a first substrate on a photoresist pattern formed on a support film so as to bring the first substrate into contact with a surface of the photoresist pattern located on a side opposite to the support film;
   pressure-bonding the support film, the photoresist pattern and the first substrate;
   a support film release step for releasing the support film after the pressure-bonding the support film, the photoresist pattern and the first substrate; and
   disposing a second substrate on the photoresist pattern so as to bring the second substrate into contact with a surface of the photoresist pattern located on a side opposite to the first substrate; and
   pressure-bonding the first substrate, the photoresist pattern and the second substrate,
   wherein the photoresist pattern is formed by site-selectively exposing a photosensitive resin composition layer laminated on the support film and then developing the layer, and a photoresist pattern is not directly formed on the first substrate or the second substrate,
   wherein the first substrate and the second substrate are not subjected to development.

2. The substrate bonding method according to claim 1, wherein the support film is a PET film.

3. The substrate bonding method according to claim 1, wherein the first substrate has a site causing a change on a surface brought into contact with the photoresist pattern by at least one step selected from the group consisting of the pressure-bonding, the site-selective exposing and the developing, and/or the photosensitive resin composition.

4. The substrate bonding method according to claim 1, wherein the first substrate has a structure on at least part of a surface brought into contact with the photoresist pattern.

5. The substrate bonding method according to claim 4, wherein the structure is at least one selected from the group consisting of wiring, a circuit and an electrode.

6. The substrate bonding method according to claim 1, wherein the pressure-bonding the support film, the photoresist pattern and the first substrate is carried out under conditions of 0.001 to 1000 MPa.

7. The substrate bonding method according to claim 1, wherein the pressure-bonding the support film, the photoresist pattern and the first substrate is carried out at a temperature of 100° C. or higher.

8. The substrate bonding method according to claim 1, wherein the pressure-bonding the first substrate, the photoresist pattern and the second substrate is carried out under conditions of 100 to 300° C. and 0.001 to 1000 MPa.

9. A method for producing a laminated body by laminating a first substrate, a photoresist pattern and a second substrate in this order using the substrate bonding method according to claim 1.

\* \* \* \* \*